United States Patent
Kunishi et al.

(10) Patent No.: US 6,780,456 B2
(45) Date of Patent: Aug. 24, 2004

(54) METHOD OF MANUFACTURING ELECTRONIC PART, ELECTRONIC PART AND ELECTROLESS PLATING METHOD

(75) Inventors: Tatsuo Kunishi, Takefu (JP); Toshi Numata, Fukui (JP); Junichi Saitoh, Fukui (JP); Yukio Sakabe, Kyoto (JP)

(73) Assignee: Murata Manufactruing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/315,949

(22) Filed: Dec. 11, 2002

(65) Prior Publication Data

US 2003/0138571 A1 Jul. 24, 2003

(30) Foreign Application Priority Data

Dec. 18, 2001 (JP) ........................................ 2001-385164

(51) Int. Cl.[7] .............................. B05D 5/12; B05D 1/18; B05D 1/36; B05D 3/12
(52) U.S. Cl. .................. 427/58; 427/123; 427/125; 427/437; 427/438; 427/443.1; 427/404; 427/405; 427/240; 427/346
(58) Field of Search .......................... 427/58, 123, 125, 427/437, 438, 443.1, 404, 405, 240, 346

(56) References Cited

U.S. PATENT DOCUMENTS

| 4,822,468 | A | * | 4/1989 | Kanehiro | .................... 204/213 |
| 4,908,685 | A | * | 3/1990 | Shibasaki et al. | ........... 257/425 |
| 5,258,061 | A | * | 11/1993 | Martyak et al. | ........... 106/1.22 |
| 6,586,047 | B2 | * | 7/2003 | Durkin et al. | .............. 427/217 |

FOREIGN PATENT DOCUMENTS

| JP | 63-096274 | 4/1988 |
| JP | 07-161567 | 6/1995 |
| JP | 10-135607 | 5/1998 |
| JP | 2002-180260 | 6/2002 |

* cited by examiner

Primary Examiner—Michael Barr
(74) Attorney, Agent, or Firm—Dickstein, Shapiro, Morin & Oshinsky, LLP

(57) ABSTRACT

A work piece is mixed with Ni pieces having an average diameter of 1 mm and exhibiting catalytic activity to oxidation reaction of sodium phosphinate ($NaH_2PO_2$) added as a reducing agent in a plating bath containing the reducing agent and a Ni salt to form a Ni—P film on an electrode made of Cu, Ag or Ag—Pd by auto-catalytic electroless plating. Then, the work piece is dipped in a plating bath containing an Au salt to form an Au film on the surface of the Ni—P film by substitutional electroless plating. This method is capable of forming a desired plating film only on a desired portion at a low cost.

21 Claims, 2 Drawing Sheets

METHOD OF MANUFACTURING ELECTRONIC PART, ELECTRONIC PART AND ELECTROLESS PLATING METHOD

BACKGROUND OF THE INVENTION

1. Field of the Invention

The present invention relates to a method of manufacturing an electronic part, an electronic part, and an electroless plating method. Particularly, the present invention relates to a method of manufacturing a chip-type electronic part such as a monolithic capacitor, a noise filter, or the like, and an electronic part manufactured by the manufacturing method.

2. Description of the Related Art

In the field of electronic parts, a surface of an electrode is often plated with nickel or gold for improving a bonding ability, solderability, a conductive resin bonding ability, heat resistance, corrosion resistance, etc., obtaining a highly functional electronic part having excellent reliability.

As is generally known, plating methods are roughly divided according to coating methods into electrolytic plating in which electrolysis is performed by passing a current through a plating solution containing metal ions to deposit a metal on a work piece, and electroless plating. Electroless plating includes an auto-catalytic type in which electrons produced by oxidation reaction of a reducing agent added to a plating solution are used for metal deposition reaction, and a substitutional type using substitution reaction between a base metal and metal ions in a solution.

In the auto-catalytic electroless plating, a surface of an electrode must be made catalytically active to oxidation reaction of the reducing agent. Therefore, a member to be plated is conventionally dipped in a catalyst solution containing Pd (palladium) to treat the surface of a Cu electrode so that the surface of the electrode becomes catalytically active.

However, as described above, when the member to be plated is dipped in the catalyst solution containing Pd, Pd adheres to portions other than the electrode to be made catalytically active, and thus Ni plating proceeds with Pd serving as nuclei to possibly deposit Ni on the portions other than the electrode. Furthermore, a degreasing step and an etching step are required as pre-treatments for applying a Pd catalyst, thereby complicating the manufacturing process. Therefore, this type of plating is principally performed by electrolytic plating.

On the other hand, it has recently been found that by using a boron-based compound as a reducing agent, electroless plating can be performed directly on an electrode without performing a catalytic treatment with Pd. Therefore, a technique based on this finding is proposed, in which a Ni—B layer, a Ni—P layer and an Au layer are successively laminated on a Cu electrode by electroless plating (Japanese Unexamined Patent Application Publication No. 10-135607).

In this conventional technique, electroless plating can be performed on a work piece without application of a Pd catalyst thereto, and thus the Ni—B layer, the Ni—P layer and the Au layer are successively laminated by electroless plating. Therefore, a Ni-based film and Au-based film can be formed only on the surface of the electrode without the formation of a plating film on portions other than the electrode.

However, the electroless plating by the above-described plating methods has the following problems.

(1) A multi-terminal electronic part having a plurality of terminals has difficulties in uniformly supplying electric power to the terminals, thereby causing variations in thickness of plating films due to non-uniformity in thickness of the plating films of the terminals. In this case, a necessary and minimum thickness must be secured, and thus plating conditions must be set to permit the formation of a plating film based on the minimum thickness. Therefore, the thickness of the plating film is increased as a whole, and particularly in Au plating, the cost is increased due to the high cost of a material itself. In Ni plating, a Ni plating film is likely to be separated from the electrode due to film stress.

(2) Also, in a small-size part such as a chip-type electronic part, so-called barrel plating is widely put into practical used. On the other hand, further miniaturization of electronic parts is required at present.

Namely, electronic parts are possibly caught in many holes formed in a barrel inner wall with miniaturization of electronic parts, and thus the opening diameter of the holes must be decreased. However, a decrease in the diameter of the holes worsens a flow of a plating solution.

In barrel plating, plating is performed in a barrel device in which many conductive media are charged for securing conductivity of the electrode. Therefore, the diameter of the conductive media used must be decreased to 0.8 mm or less with further miniaturization of electronic parts, and thus inexpensive media (so-called steel shots) containing relatively large conductive media of about 1 mm in diameter cannot be used. Namely, from the economical viewpoint, it is preferable to charge inexpensive steel shots having irregular shapes into the barrel device for plating. However, the opening diameter of the barrel holes must be decreased with miniaturization of electronic parts, and consequently expensive small-diameter conductive media or steel balls having a uniform shape must be used because the conductive media are possibly caught in the small-diameter holes, thereby causing an increase in the manufacturing cost.

(3) When an Au film is formed by electrolytic barrel plating, Au is deposited not only on electrodes of electronic parts but also on the conductive media. Therefore, expensive Au is excessively consumed, and particularly in Au plating for bonding, a large thickness is required to increase the manufacturing cost.

(4) Furthermore, in a low-resistance electronic part such as a varistor or the like, which comprises a ceramic material as a base material, electrons flow to the surface of the ceramic base material in electrolytic plating, and thus a plating metal is abnormally deposited on the surface of the ceramic base material. Particularly in barrel plating, a potential distribution is complicated to cause difficulties in avoiding abnormal deposition of the plating metal on the ceramic base material.

On the other hand, the electroless plating method disclosed in Japanese Unexamined Patent Application Publication No. 10-135607 is capable of plating without applying a Pd catalyst on an electrode surface, and is thus capable of forming a desired plating film only on the electrode. However, for example, when substitutional Au plating is performed directly on the surface of a Ni—B layer, there is a fear that sufficient adhesion cannot be held between the Ni—B layer and the Au layer, thereby causing the need to form a Ni—P layer having good adhesion to Au on the Ni—B layer. Therefore, the two plating films, i.e., the Ni—B layer and the Ni—P layer, must be formed between the electrode and the Au layer to cause the problem of complicating the production process. Furthermore, in forming the Ni—B layer by electroless plating, an expensive reducing agent such as dimethylaminoborane (($CH_3$)$_2$NHBH$_3$; referred to as "DMAB" hereinafter) must be used, causing the problem of increasing the manufacturing cost.

SUMMARY OF THE INVENTION

The present invention has been achieved in consideration of the above problems, and an object of the present invention is to provide an electroless plating method capable of forming a desired plating film only on a desired portion at a low cost, a method of manufacturing an electronic part, and an electronic part with excellent reliability which is manufactured by the manufacturing method at a low cost.

As described above, in barrel plating on a small-size electronic part such as a chip-type electronic part based on the electroless plating method, plating must be performed in a barrel in which small-diameter conductive media are charged, and a plating metal is also deposited on the surfaces of the conductive media to accordingly cause the need for excessive metal, thereby increasing the manufacturing cost. Furthermore, a multi-terminal electronic part causes the problem of widening a thickness distribution, and the like.

Accordingly, the inventors intensively researched in order to achieve a method of forming a plating film only on a desired portion with attention to electroless plating. As a result, it was found that even for an electrode material having no catalytic activity to oxidation reaction of a reducing agent, when metal pieces with catalytic activity to the oxidation reaction are mixed with a work piece to bring the metal pieces into contact with the work piece, the electrode of the work piece is provided with catalytic activity to permit the formation of a plating film with a desired uniform thickness only on the surface of the electrode without abnormal deposition of the metal on portions other than the electrode.

Namely, a method of manufacturing an electronic part according to the present invention comprises performing electroless plating on a work piece, which has an electrode formed on a surface thereof, by using a plating bath containing a reducing agent, wherein conductive media exhibiting catalytic activity to oxidation reaction of the reducing agent are mixed with the work piece in the plating bath containing metal ions having an electrochemically nobler potential than the oxidation-reduction potential of the reducing agent so that the plating film is formed on the electrode by electroless plating.

In auto-catalytic electroless plating, cathodic deposition reaction of the metal, and anodic oxidation reaction proceed in parallel to deposit the metal having an electrochemically nobler reversible potential than the oxidation-reduction potential of the reducing agent on the electrode as a base metal. However, in order to stationarily advance the auto-catalytic electroless plating, the deposited metal must have catalytic activity to anodic oxidation reaction of the reducing agent.

However, in the manufacturing method, the conductive media exhibiting catalytic activity to oxidation reaction of the reducing agent are mixed with the work piece to impart catalytic activity to the surface of the electrode. Therefore, electrons produced by oxidation reaction of the reducing agent are supplied to the electrode to form the desired metal only on the surface of the electrode, thereby forming a plating film thereon.

As a method of mixing the conductive media and the work piece, any desired electrolytic barrel system such as a rotating barrel system, an oscillating barrel system, an inclined barrel system, or a vibrating barrel system can be used.

Namely, the present invention is characterized in that a container containing the work piece and the conductive media is rotated, oscillated, inclined or vibrated in a plating tank filled with the plating bath to mix the work piece and the conductive media.

In conventional electroless plating, an electric current does not smoothly flow to cause disturbance in an electric current distribution unless the hole diameter of a barrel is increased to some extent, and it is thus undesirable to use small-diameter conductive media or steel shots having irregular shapes. However, in electroless plating, even when the hole diameter of the barrel device is decreased, no problem occurs, and thus the hole diameter can be decreased as much as possible. Therefore, the conductive media have a high degree of shape freedom, and thus conductive media having various shapes can be used. Namely, by using large-size conductive media preferably having an average diameter of about 1.0 mm, the conductive media can be avoided from being caught in the holes of the barrel, and even in manufacturing small-size electronic parts, expensive small-size conductive media or steel balls with a uniform shape need not be used.

Therefore, the present invention is characterized in that the conductive media preferably have an average diameter of 1.0 mm or more. The average diameter represents an average diameter of spheres, but the average diameter of various three-dimensional shapes other than spheres represents the average of maximum diameters of three-dimensional shapes.

The method of manufacturing an electronic part of the present invention is characterized in that Ni or Ni alloy pieces are preferably used as the conductive media, the work piece is mixed with the Ni pieces in the plating bath containing an Ni compound as a main component and a phosphate compound as the reducing agent to form a first plating film comprising Ni as a main component on the electrode by electroless plating, and then the work piece on which the first plating film is formed is dipped in a plating bath containing an Au compound to deposit Au on the surface of the first plating film to form a second plating film.

In the above-described manufacturing method, electrons produced by oxidation reaction of the phosphate compound are supplied onto the electrode to form the first plating film mainly composed of Ni on the electrode by oxidation-reduction reaction. When the work piece, on which the first plating film is formed, is dipped in the plating bath containing the Au compound as a main component, electrochemically less noble Ni is dissolved to release electrons, and electrochemically noble Au ions are reduced with the released electrons to form the second film (Au film) on the first plating film (Ni—P film).

As described above, in the present invention, the surface of the electrode is made catalytically active to oxidation reaction of the reducing agent so that an auto-catalytically persistent metal is deposited to form a plating film.

Therefore, by appropriately selecting a metal having catalytic activity to oxidation reaction of any of various reducing agents, it is possible to form a plating film on a base metal having no catalytic activity.

Studies on the catalytic activity of a phosphate compound, a boron compound, a nitrogen compound, and an aldehyde compound, which are generally used as reducing agents in a wide range, have already been reported.

For example, it is reported that Au, Ni, Pd, Co and Pt are catalytically more active to oxidation reaction of sodium hypophosphite ($NaH_2PO_2$) serving as the phosphate reducing agent than Cu and Ag (Ohno et al, "Catalytic Activity of Metal to Anodic Oxidation of Sodium Hypophosphite in Electroless Plating", Metal Surface Technique, Vol. 34, No. 12, 1983, pp594–599; referred to as "document 1" hereinafter).

According to document 1, by using Au, Ni, Pd, Co or Pt as the conductive media for oxidation reaction of $NaH_2PO_2$, a plating film of Ni, Co, Pt, Au, or the like can easily be formed on an electrode surface of Cu or Ag having low catalytic activity to oxidation reaction of $NaH_2PO_2$.

Namely, the method of manufacturing an electronic part of the present invention is characterized in that metal pieces composed of at least one metal selected from Au, Ni, Pd, Co, Pt and alloys thereof are used as the conductive media, and the metal pieces and the work piece are mixed in a plating bath containing a salt of a metal selected from Ni, Co, Pd and Au as a main component, and a phosphate compound as the reducing agent, to form a plating film on the electrode by electroless plating.

It is also reported that when a boron compound such as sodium tetrahydroborate ($NaBH_4$), DMAB (($CH_3$)$_2$NHBH$_3$), or the like is used as the reducing agent, Ni, Co, Pd, Pt and Au have higher catalytic activity to oxidation reaction of the boron compound than Cu and Ag (Ohno et al, "Catalytic Activity of Metal to Anodic Oxidation of Sodium Borohydride and Dimethylaminoborane in Electroless Plating", Electrochemistry, Vol. 53, No. 3, 1985, pp196–201; referred to as "document 2" hereinafter).

According to document 2, by using Ni, Co, Pd, Pt or Au as the conductive media for oxidation reaction of the boron compound, a plating film of Ni, Co or Au can be formed on an electrode surface composed of Cu or Ag having low catalytic activity to oxidation reaction of the boron compound.

Namely, the method of manufacturing an electronic part of the present invention is characterized in that metal pieces composed of at least one metal selected from Ni, Co, Pd, Pt, Au, and alloys thereof are used as the conductive media, and the metal pieces and the work piece are mixed in a plating bath containing a salt of a metal selected from Ni, Co, Pd and Au as a main component, and a boron compound as the reducing agent, to form a plating film on the electrode by electroless plating.

When the boron compound is a tetrahydroborate compound, the reversible potential of Pt is nobler than the oxidation-reduction potential of the tetrahydroborate compound, and thus the plating solution may comprise a metal selected from Ni, Co, Au, and Pt.

Namely, the plating bath preferably further contains a metal salt of a metal selected from nickel, cobalt, palladium, gold, and platinum. In other words, the plating bath preferably further contains a metal salt of a metal selected from four metals including the unselected three metals of Ni, Co, Pd and Au, and platinum.

It is further reported that when hydrazine ($N_2H_4$) as a nitrogen compound is used as the reducing agent, Co, Ni, Pt, and Pd have higher catalytic activity to oxidation reaction of $N_2H_4$ than Cu and Ag (Ohno et al, "Catalytic Activity of Metal to Anodic Oxidation of Formaldehyde and Hydrazine in Electroless Plating", Electrochemistry, Vol. 53, No. 3, 1985, pp190–195; referred to as "document 3" hereinafter).

According to document 3, by using Co, Ni, Pt, or Pd as the conductive media for oxidation reaction of $N_2H_4$, a plating film of Ni, Co, Pd, Au or Pt can be formed on an electrode surface composed of Cu or Ag having low catalytic activity to oxidation reaction of $N_2H_4$.

Namely, the method of manufacturing an electronic part of the present invention is characterized in that metal pieces comprising at least one metal selected from Co, Ni, Pt, Pd, and alloys thereof are used as the conductive media, and the metal pieces and the work piece are mixed in the plating bath containing a salt of a metal selected from Ni, Co, Pd and Pt as a main component, and a nitrogen compound as the reducing agent, to form a plating film on the electrode by electroless plating.

The present invention is based on the assumption that the electrode has no or low catalytic activity to oxidation reaction of the reducing agent, and ordinary examples of the electrode material include Cu, Ag, and Ag—Pd.

Namely, the present invention is characterized in that the electrode is a Cu electrode, a Cu alloy electrode, an Ag electrode, a Ni electrode or an Ag alloy electrode.

It is also reported in document 3 that when formaldehyde (HCHO) is used as the reducing agent, Cu, Au, and Ag have higher catalytic activity to oxidation reaction of HCHO than Ni. Therefore, by using Cu, Au or Ag as the conductive media, a plating film of Cu, Au or Ag can easily be formed on a Ni electrode having low catalytic activity to HCHO.

Namely, the method of manufacturing an electronic part of the present invention is characterized in that metal pieces composed of at least one metal selected from Cu, Au, Ag, and alloys thereof are used as the conductive media, and the metal pieces and the work piece are mixed in a plating bath containing a salt of a metal selected from Cu, Ag, and Au as a main component, and an aldehyde compound as the reducing agent, to form a plating film on the electrode (Ni electrode) by electroless plating.

An electronic part of the present invention is characterized by being manufactured by the above-descried manufacturing method.

The electronic part of the present invention can be obtained at a low cost without a surface treatment with a catalyst solution containing Pt so that only an electrode portion is plated with good uniformity in the thickness.

Particularly, a Ni—P layer having good adhesion to Au can be formed directly on a copper electrode, thereby obtaining a high-quality electronic part having excellent reliability at a low cost.

The present invention also provides an electroless plating method comprising mixing a work piece having a portion to be plated and conductive media exhibiting catalytic activity to oxidation reaction of a reducing agent in a plating bath containing the reducing agent and metal ions having an electrochemically nobler deposition potential than the oxidation-reduction potential of the reducing agent to form a plating film on the portion to be plated based on the metal ions.

Besides the electronic part, various materials to be plated can be used, and the portion to be plated is not limited to an electrode provided on the surface of the electronic part.

In the electroless plating method, a container containing the work piece and the conductive media can be rotated, oscillated, inclined or vibrated in a plating tank filled with the plating bath to mix the work piece and the conductive media. As described above, the average diameter of the conductive media is preferably 1.0 mm or more.

In the electroless plating method of the present invention, nickel pieces or nickel alloy pieces may be mixed with the work piece in a plating bath containing a phosphate compound such as sodium hypophosphite serving as the reducing agent, and a nickel compound as a precursor of metal ions to form a first plating film mainly composed of nickel on the portion to be plated by electroless plating, and then the work piece on which the first plating film is formed may be dipped in a plating bath containing a gold compound to deposit gold on the surface of the first plating film to form a second plating film mainly composed of gold. In this case, the material of the portion to be plated is preferably copper, silver, nickel or an alloy thereof.

In the electroless plating method of the present invention, metal pieces of at least one metal selected from gold, nickel, palladium, cobalt, platinum, and alloys thereof may be used as the conductive media, and the work piece and the metal pieces may be mixed in a plating bath containing a phosphate compound serving as the reducing agent, and a metal salt of a metal selected from nickel, cobalt, palladium and gold as a precursor of metal ions, to form a plating film on the portion to be plated by electroless plating. In this case, the material of the portion to be plated is preferably copper, silver, nickel or an alloy thereof.

In the electroless plating method of the present invention, metal pieces of at least one metal selected from nickel, cobalt, palladium, platinum, gold, and alloys thereof may be used as the conductive media, and the work piece and the metal pieces may be mixed in a plating bath containing a boron compound such as sodium tetrahydroborate or DMAB serving as the reducing agent, and a metal salt of one or two metals selected from nickel, cobalt, palladium, gold and platinum as a precursor of metal ions, to form a plating film on the portion to be plated by electroless plating. In this case, the material of the portion to be plated is preferably copper, silver, nickel or an alloy thereof.

In the electroless plating method of the present invention, metal pieces of at least one metal selected from cobalt, nickel, platinum, palladium, and alloys thereof may be used as the conductive media, and the work piece and the metal pieces may be mixed in a plating bath containing a nitrogen compound such as hydrazine or the like serving as the reducing agent, and a metal salt of a metal selected from nickel, cobalt, palladium, gold and platinum as a precursor of metal ions, to form a plating film on the portion to be plated by electroless plating. In this case, the material of the portion to be plated is preferably copper, silver, nickel or an alloy thereof.

In the electroless plating method of the present invention, metal pieces of at least one metal selected from copper, gold, silver, and alloys thereof may be used as the conductive media, and the work piece and the metal pieces may be mixed in a plating bath containing an aldehyde compound such as formaldehyde serving as the reducing agent, and a metal salt of a metal selected from copper, silver and gold as a precursor of metal ions, to form a plating film on the portion to be plated by electroless plating. In this case, the material of the portion to be plated is preferably nickel.

DESCRIPTION OF THE PREFERRED EMBODIMENTS

Embodiments of the present invention will be described in detail below with reference to the drawings.

Figure 1:
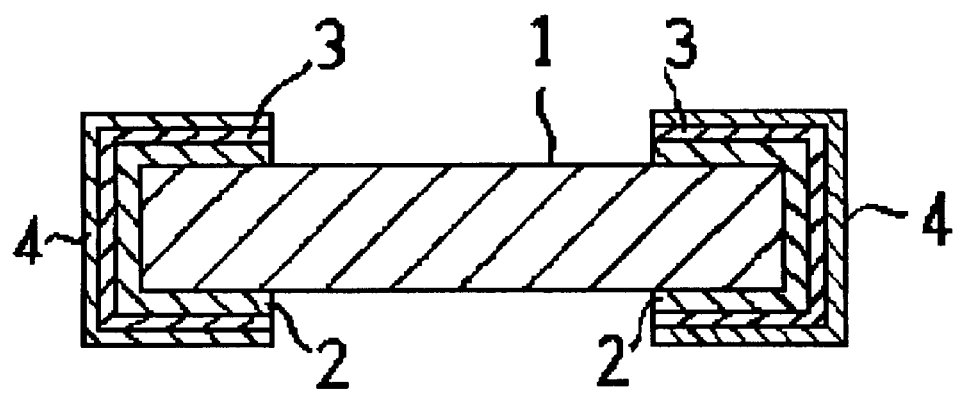
FIG. 1 is a sectional view showing an electronic part manufactured by a manufacturing method according to an embodiment of the present invention.

FIG. 1 is a sectional view schematically showing a chip-type electronic part manufactured by a method of manufacturing an electronic part according to an embodiment of the present invention.

In FIG. 1, a ceramic base material 1 preferably comprises a rectangular plate made of a ceramic material such as barium titanate, lead zirconate titanate (PZT), or the like, and external electrodes 2 made of Cu, Ag, Ag—Pd, or the like are formed at both ends of the ceramic base material 1. Furthermore, a Ni—P film 3 is deposited on each of the external electrodes 2, and an Au film 4 is further deposited on the surface of the Ni—P film 3.

Next, the method of manufacturing the electronic part will be described.

First, a ceramic sintered product formed through predetermined molding and burning processes is cut into a rectangular plate to form the ceramic base material 1, and then an electrode material such as Cu, Ag, Ag—Pd, or the like is coated on both ends of the ceramic base material 1 by a known method such as a screen printing or dipping method, and then baked to form the external electrodes 2 on both ends of the ceramic base material 1.

In this embodiment, the Ni—P film 3 and the Au film 4 are formed on the surface of each of the electrodes 2 by electroless plating. Namely, the Ni—P film 3 having a thickness of 3 to 6 $\mu$m is formed by auto-catalytic electroless plating (referred to as "auto-catalytic plating" hereinafter) using a reducing agent, and the Au film 4 having a thickness of 0.2 $\mu$m or less is formed by substitutional electroless plating (referred to as "substitutional plating" hereinafter) using substitution reaction with Ni.

The methods of forming the Ni—P film 3 and the Au film 4 will now be described below.

(1) Ni—P Film 3

In this embodiment, the Ni—P film 3 is formed by auto-catalytic plating using the reducing agent, but cathodic deposition reaction of a metal and anodic oxidation reaction of the reducing agent proceed in parallel during the auto-catalytic plating.

In order to stationarily advance the auto-catalytic plating, the oxidation-reduction potential of the reducing agent must be electrochemically less noble than the deposition potential of the metal material constituting the electrodes 2. From this viewpoint, in this embodiment, the oxidation-reduction potential E is as low as −1.119 V (Vs. NHE; this is true for the description below), and NaH$_2$PO$_2$ exhibiting a strong reducing ability is used.

NaH$_2$PO$_2$ produces oxidation reaction represented by chemical formula (1) in an acidic plating bath.

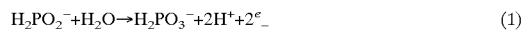

$$H_2PO_2^- + H_2O \rightarrow H_2PO_3^- + 2H^+ + 2e^- \qquad (1)$$

Namely, NaH$_2$PO$_2$ produces oxidation reaction represented by chemical formula (1) to release electrons, and the released electrons are partially supplied to the electrodes 2 to deposit Ni—P on each of the electrodes 2.

However, in order to deposit Ni—P, the electrode material constituting the electrodes 2 must be catalytically active to oxidation reaction of NaH$_2$PO$_2$. However, the above-described electrode material is considered to have no or extremely low catalytic activity to oxidation reaction of NaH$_2$PO$_2$.

In this embodiment, therefore, a necessary amount of Ni pieces, preferably having an average diameter of 1 mm, are mixed as conductive media having catalytic activity to NaH$_2$PO$_2$ in the plating bath containing a Ni component as a deposited metal, and the pieces are rotated in the plating bath at a predetermined rotational speed to bring the Ni pieces into contact with the work piece in the plating bath, making the surfaces of the electrodes catalytically active.

Namely, the work piece is brought into contact with many Ni pieces catalytically active to $NaH_2PO_2$ to catalytically activate the surfaces of the electrodes. On the other hand, reactions represented by chemical formulae (2) and (3) proceed in the plating bath to form the Ni—P film 3 on the surface of each of the electrodes 2.

$$Ni^{2+} + 2e^- \rightarrow Ni \quad (2)$$

$$N_2PO_2^- + 2H^+ e^- \rightarrow 2H_2O + P \quad (3)$$

The composition of the plating bath is not limited as long as the Ni—P film 3 can be formed on the surface of each of the electrodes 2 by oxidation-reduction reaction in the plating bath. For example, a plating bath containing acidic nickel such as nickel chloride as a main component, $NaH_2PO_2$ as the reducing agent, a complexing agent, and a buffer for preventing a change in hydrogen-ion exponent pH, or a plating bath further containing a stabilizer, a surfactant, and the like according demand can be used.

As a rotating container for mixing the Ni pieces and the work piece in the plating bath, a barrel container used in electrolytic barrel plating is preferably used from the economical viewpoint.

Although, in this embodiment, the Ni pieces and the work piece are mixed by rotating the plating bath, desired electroless plating can be performed by any one of various systems such as an oscillating barrel system, an inclined barrel system, a vibrating barrel system, etc. other than the rotating barrel system. This is because unlike in electrolytic plating, in electroless plating, disturbance of an electric current distribution need not be taken into consideration, and the hole diameter and opening ratio of the barrel are not so important.

(2) Au Film 4

Au is an expensive metal, and it is sufficient to secure a necessary and minimum thickness. Therefore, the Au film 4 is preferably formed by substitutional plating in which reactivity decreases when the Ni—P 3 is mostly coated.

Namely, when the work piece, on which the Ni—P film 3 electrochemically less noble than Au is formed, is dipped in the plating bath containing Au, electrons are released by dissolution of less noble metal Ni to reduce Au ions with the electrons, and consequently the Au film 4 is formed on the Ni—P film 3, as represented by chemical formulae (4) and (5).

$$Ni \rightarrow Ni^{2+} + 2e^- \quad (4)$$

$$Au^+ + e^- \rightarrow Au \quad (5)$$

In this embodiment, first, a necessary amount of Ni pieces is mixed with the work piece in the plating bath to bring the Ni pieces into contact with the electrodes 2, thereby catalytically activating the surfaces of the electrodes 2. Then, Ni—P having an electrochemically nobler reversible potential than the oxidation-reduction potential of $NaH_2PO_2$ as the reducing agent is deposited on the surface of each of the electrodes 2 to form the Ni—P film 3 on the surface of each electrode 2. Therefore, unlike in the conventional plating methods, a plating film can be formed only on the surfaces of the electrodes 2 without the need to apply a Pd catalyst to the surfaces of the electrodes 2.

In other words, in this embodiment, plating reaction proceeds only by oxidation-reduction reaction between the deposited metal and the reducing agent to form the plating film on the catalytically activated surface of each of the electrodes 2. Therefore, the plating film can be formed only on the surfaces of the electrodes 2 without abnormal deposition of the plated metal on portions other than the electrodes 2.

Even in a small-size electronic part such as the above-described chip-type electronic part, unlike in electrolytic plating, small-diameter conductive media need not be used, and thus an increase in the manufacturing cost can be prevented to permit desired plating by a simple method.

Furthermore, unlike in electrolytic plating, an electric current does not flow in the plating bath and cannot influence the electric current distribution, and thus deposition reaction proceeds uniformly over the entire region of the electrodes in contact with the plating bath. Therefore, even in application to a multi-terminal electronic part having a complicated electrode pattern, a thickness distribution of the terminals can be controlled to be substantially uniform, thereby avoiding excessive consumption of the plating material. From this viewpoint, it is possible to avoid an increase in the manufacturing cost.

As described above, in the present invention, the surfaces of the electrodes, which are basically catalytically inactive to oxidation reaction of the reducing agent, are made catalytically active by contact with the conductive media so that a metal is deposited on the surfaces of the electrodes by oxidation-reduction reaction between the reducing agent and the deposited metal.

Therefore, the object of the present invention can be achieved by appropriately selecting a metal having catalytic activity to oxidation reaction of any one of various reducing agents, and variously combining the reducing agent, the conductive media and the electrode material.

A description will now be made of a case in which each of $NaH_2PO_2$, $NaBH_4$, $(CH_3)_2NHBH_3$, $N_2H_4$, and HCHO is used as the reducing agent.

(1) $NaH_2PO_2$

In document 1 described above in "Means for Solving the Problems", it is reported that evaluation of catalytic activities of various metals to oxidation reaction of $NaH_2PO_2$ based on the anodic oxidation initial potential indicates the decreasing order of catalytic activities, Au>Ni>Pd>Co>Pt>Cu>Ag.

Therefore, Au, Ni, Pd, Co, or Pt, which have higher catalytic activity than Cu and Ag, is mixed as the conductive media with the work piece to bring the conductive media into contact with a Cu electrode, an Ag electrode or an Ag—Pd electrode so that the surface of the electrode can be rendered catalytically active to oxidation reaction $NaH_2PO_2$.

Namely, anodic oxidation reaction of $NaH_2PO_2$ is represented by chemical formulae (6) and (8) in an acidic aqueous solution and an alkaline aqueous solution, respectively, and oxidation-reduction potentials E are represented by mathematical formulae (7) and (9) in the acidic aqueous solution and the alkaline aqueous solution, respectively.

$$H_2PO_2^- + H_2O \rightarrow H_2PO_3^- + 2H_+ + 2e^- \quad (6)$$

$$E = -0.50 - 0.06\, pH \quad (7)$$

$$H_2PO_2^- + 3OH^- \rightarrow HPO_3^{2-} + 2H_2O + 2e^- \quad (8)$$

$$E = -0.30 - 0.90\, pH \quad (9)$$

In these formulae, pH represents the hydrogen ion exponent of the acidic or alkaline aqueous solution.

Therefore, auto-catalytic plating proceeds in the plating bath containing metal ions having an electrochemically nobler reversible potential than the oxidation-reduction potential E of $NaH_2PO_2$ to form a desired plating film.

In this case, a metal salt containing Ni, Co, Pd or Au can be used for the plating bath.

(2) NaBH4

In document 2 described above in "Means for Solving the Problems", it is reported that evaluation of catalytic activities of various metals to oxidation reaction of $NaBH_4$ based on the anodic oxidation initial potential indicates the decreasing order of catalytic activities, Ni>Co>Pd>Pt>Au>Ag>Cu.

Therefore, Ni, Co, Pd, Pt, or Au, which have higher catalytic activity than Cu and Ag, is mixed as the conductive media with a work piece to bring the conductive media into contact with a Cu electrode, an Ag electrode or an Ag—Pd electrode so that the surface of the electrode can be rendered catalytically active to oxidation reaction $NaBH_4$.

Namely, anodic oxidation reaction of $NaBH_4$ is represented by chemical formula (10), and oxidation-reduction potential E is represented by mathematical formula (11).

$$BH_4^- + 8OH^- \rightarrow BO_2^- + 6H_2O + 8e^- \tag{10}$$

$$E = -0.45 - 0.06\, pH \tag{11}$$

Therefore, auto-catalytic plating proceeds in the plating bath containing metal ions having an electrochemically nobler reversible potential than the oxidation-reduction potential E of $NaBH_4$ to form a desired plating film.

In this case, a metal salt containing Ni, Co or Au can be used for the plating bath.

Although, in this embodiment, $NaBH_4$ is used as the reducing agent, $KBH_4$ having the same properties as $NaBH_4$ can also be used.

(3) $(CH_3)_2NHBH_3$

In document 2, it is reported that evaluation of catalytic activities of various metals to oxidation reaction of $(CH_3)_2NHBH_3$ based on the anodic oxidation initial potential indicates the decreasing order of catalytic activities, Ni>Co>Pd>Au>Pt>Ag.

Therefore, Ni, Co, Pd, Au, or Pt, which have higher catalytic activity than Cu and Ag, is mixed as the conductive media with a work piece to bring the conductive media into contact with a Cu electrode, an Ag electrode or an Ag—Pd electrode so that the surface of the electrode can be rendered catalytically active to oxidation reaction $(CH_3)_2NHBH_3$.

Namely, anodic oxidation reaction of $(CH_3)_2NHBH_3$ with hydrogen generation is represented by chemical formula (12), and anodic oxidation reaction of $(CH_3)_2NHBH_3$ with ionization is represented by chemical formula (13).

$$(CH_3)_2NHBH_3 + 4OH^- \rightarrow (CH_3)_2NH + BO_2^- + 2H_2O + (3/2)H_2 + 3e^- \tag{12}$$

$$(CH_3)_2NHBH_3 + 7OH^- \rightarrow (CH_3)_2NH + BO_2^- 5H_2O + 6e^- \tag{13}$$

Therefore, auto-catalytic plating proceeds in the plating bath containing metal ions having an electrochemically nobler reversible potential than the oxidation-reduction potential E of $(CH_3)_2NHBH_3$ to form a desired plating film.

In this case, a metal salt containing Ni, Co or Au can be used for the plating bath.

(4) $N_2H_4$

In document 3 described above in "Means for Solving the Problems", it is reported that evaluation of catalytic activities of various metals to oxidation reaction of $N_2H_4$ based on the anodic oxidation initial potential indicates the decreasing order of catalytic activities, Co>Ni>Pt>Pd>Cu>Ag>Au.

Therefore, Co, Ni, Pt, or Pd, which have higher catalytic activity than Cu and Ag, is mixed as the conductive media with the work piece to bring the conductive media into contact with a Cu electrode, an Ag electrode or an Ag—Pd electrode so that the surface of the electrode can be rendered catalytically active to oxidation reaction of $N_2H_4$.

Namely, anodic oxidation reaction of $N_2H_4$ with hydrogen generation is represented by chemical formula (14), and anodic oxidation reaction of $N_2H_4$ without hydrogen generation is represented by chemical formula (16). The oxidation-reduction potentials E with hydrogen generation and without hydrogen generation are represented by mathematical formulae (15) and (17), respectively.

$$N_2H_4 + 2OH^- \rightarrow N_2 + H_2 + 2H_2O + 2e^- \tag{14}$$

$$E = 1.57 - 0.06\, pH \tag{15}$$

$$N_2H_4 + 4OH^- \rightarrow N_2 + 4H_2O + 4e^- \tag{16}$$

$$E = -0.31 - 0.06\, pH \tag{17}$$

Therefore, auto-catalytic plating proceeds in the plating bath containing metal ions having an electrochemically nobler reversible potential than the oxidation-reduction potential E of $N_2H_4$ to form a desired plating film.

In this case, a metal salt containing Ni, Co, Pd or Pt can be used for the plating bath.

(5) HCHO

In document 3, it is reported that evaluation of catalytic activities of various metals to oxidation reaction of HCHO based on the anodic oxidation initial potential indicates the decreasing order of catalytic activities, Cu>Au>Ag>Pt>Pd>Ni>Co.

Therefore, Cu, Au, Ag, Pt, or Pd, which have higher catalytic activity than Ni, is mixed as the conductive media with the work piece to bring the conductive media into contact with a Ni electrode so that the surface of the electrode can be rendered catalytically active to oxidation reaction of HCHO.

Namely, anodic oxidation reaction of HCHO with hydrogen generation is represented by chemical formula (18), and anodic oxidation reaction of HCHO without hydrogen generation is represented by chemical formula (20). The oxidation-reduction potentials E with hydrogen generation and without hydrogen generation are represented by mathematical formulae (19) and (21), respectively.

$$2HCHO + 4OH^- \rightarrow 2HCOO^- + H_2 + 2H_2O + 2e^- \tag{18}$$

$$E = 0.32 - 0.12\, pH \tag{19}$$

$$HCHO + 3OH^- \rightarrow HCOO^- + 2H_2O + 2e^- \tag{20}$$

$$E = 0.19 - 0.09\, pH \tag{21}$$

Therefore, auto-catalytic plating proceeds in the plating bath containing metal ions having an electrochemically nobler reversible potential than the oxidation-reduction potential E of HCHO to form a desired plating film.

In this case, a metal salt containing Cu, Ag, or Au can be used for the plating bath.

Although, in this embodiment, HCHO is used as the reducing agent, an aldehyde compound, glyoxylic acid (CHOCOOH), similar to $NaBH_4$ can also be used.

The results of the reducing agents (1) to (5) are summarized in Table 1.

TABLE 1

| No. | Reducing agent | Deposited metal | Conductive media | Electrode material |
|---|---|---|---|---|
| 1 | $NaH_2PO_2$ | Ni—P, Co—P, Pd—P, Au | Au, Ni, Pd, Co, Pt | Cu, Ag, Ag—Pd |
| 2 | $NaBH_4$ or $KBH_4$ | Ni—B, Co—B, Au, Pt | Ni, Co, Pd, Pt, Au | Cu, Ag, Ag—Pd |
| 3 | $(CH_3)_2NHBH_3$ | Ni—B, Co—B, Au | Ni, Co, Pd, Au, Pt | Cu, Ag, Ag—Pd |
| 4 | $N_2H_4$ | Ni, Co, Pd, Au, Pt | Co, Ni, Pt, Pd | Cu, Ag, Ag—Pd |
| 5 | HCHO or CHOCOOH | Cu, Ag, Au | Cu, Au, Ag | Ni |

Table 1 indicates that desired plating can be performed by any one of various combinations of the reducing agent, the deposited metal, the conductive media, and the electrode material, thereby permitting application to plating of various electronic parts such as printed circuit boards as well as chip-type electronic parts, which are used for a variety of applications.

As described above, in the present invention, an electrode material having low catalytic activity to oxidation reaction of any one of various reducing agents can be rendered catalytically active through the conductive media, thereby permitting the formation of a plating film by auto-catalytic plating with any one of various reducing agents.

Embodiments

Embodiments of the present invention will be described in detail below.

First Embodiment

EXAMPLE 1

The inventors formed a Cu electrode on either end of a ceramic base material of 3.2 mm long, 1.6 mm wide and 1.0 mm thick to form ten materials to be plated.

Next, the ten materials to be plated were dipped in a barrel having a internal volume of $1.90 \times 10^{-4}$ m$^3$ and filled with a plating bath (first plating bath) having the plating composition below, and 7.9 g (about 1500 pieces) of Ni pieces having a diameter of about 1 mm were placed in the barrel. Then, the barrel was rotated at a rotational speed of 0.05 s$^{-1}$ (=2 rpm) for 30 minutes to form a Ni—P film on the surface of each of the Cu electrodes by auto-catalytic plating.

[Composition of the first plating bath]

| Metal salt: | 30.0 kg/m$^3$ of nickel chloride |
|---|---|
| Reducing agent: | 10.0 kg/m$^3$ of sodium phosphinate |
| Complexing agent: | 10.0 kg/m$^3$ of sodium citrate |
| | 10.0 kg/m$^3$ of sodium glycolate |
| pH: | 4.2 |
| Bath temperature: | 85° C. |

Next, the materials to be plated, on each of which the Ni—P film was formed, were dipped in a plating bath (second plating bath) having the plating composition below to form an Au film on each of the Ni—P films by substitutional plating, for preparing test pieces of Example 1.

[Composition of the second plating bath]

| Metal salt: | 5.5 kg/m$^3$ of gold sulfite |
|---|---|
| Complexing agent: | 15.0 kg/m$^3$ of sodium sulfite |
| | 45.0 kg/m$^3$ of disodium ethylenediaminetetraacetate |
| pH: | 6.8 |
| Bath temperature: | 85° C. |

EXAMPLE 2

An Ag—Pd electrode was formed on either end of a ceramic base material by the same method as Example 1, and a Ni—P film and an Au film were formed on the surface of the Ag—Pd electrode according to the same procedure as Example 1 to prepare test pieces of Example 2.

EXAMPLE 3

An Ag electrode was formed on either end of a ceramic base material by the same method as Example 1, and a Ni—P film and an Au film were formed on the surface of the Ag electrode according to the same procedure as Example 1 to prepare test pieces of Example 3.

Table 2 shows the thicknesses of the films in each of the examples.

The thickness was measured by a fluorescent X-ray thickness gauge (produced by Seiko Instruments Inc., SEA5120).

TABLE 2

| | Electrode | Thickness ($\mu$m) | |
|---|---|---|---|
| Example | material | Ni—P film | Au film |
| 1 | Cu | 5.43 | 0.20 |
| 2 | Ag—Pd | 5.21 | 0.08 |
| 3 | Ag | 4.15 | 0.03 |

Table 2 indicates that a Ni—P film can be formed on the surface of an electrode comprising an electrode material exhibiting no catalytic activity to sodium phosphinate ($NaH_2PO_2$) by autocatalytic plating without application of a Pd catalyst, and then an Au film can be formed on the Ni—P film by substitutional plating.

Second Embodiment

The inventors prepared ten test pieces according to the same procedure as Example 1 of the first embodiment except that a ceramic base material of 0.6 mm long, 0.3 mm wide and 0.3 mm thick was used, and four test pieces were sampled from these ten test pieces, and measured with respect to thickness by the same method as the first example.

Table 3 shows the results of thickness measurement.

TABLE 3

| | Electrode | Thickness ($\mu$m) | |
|---|---|---|---|
| Example | material | Ni—P film | Au film |
| 11 | Cu | 4.12 | 0.07 |
| 12 | Cu | 3.53 | 0.07 |
| 13 | Cu | 3.92 | 0.09 |
| 14 | Cu | 3.76 | 0.06 |

Table 3 indicates that even for small-size chip-type electronic parts, when Ni pieces having an average diameter of 1 mm are placed in a barrel, and mixed with materials to be plated to bring the Ni pieces into contact with the materials to be plated, to render the surfaces of electrodes catalytically active, a Ni—P film can be formed on the surface of a Cu electrode. It was also recognized that an Au thin film of 0.10 µm or less in thickness can easily be formed by substitutional plating.

Third Embodiment

The inventors formed a Cu electrode pattern having a predetermined complicated shape on a surface of a ceramic base material of 4.5 mm long, 2.0 mm wide and 0.5 mm thick, and a Ni—P film and an Au film were formed by the same method as Example 1 of the first embodiment to prepare test pieces of Example 21.

The inventors formed the same electrode pattern as described above on a surface of a ceramic base material, and a Ni—P film and an Au film were formed on the electrode pattern by electrolytic plating to prepare test pieces of Comparative Example 21.

In electrolytic plating, the current density in Ni plating was set to 0.3 A/dm$^2$, and the current density in Au plating was set to 0.1 A/dm$^2$.

Figure 2:
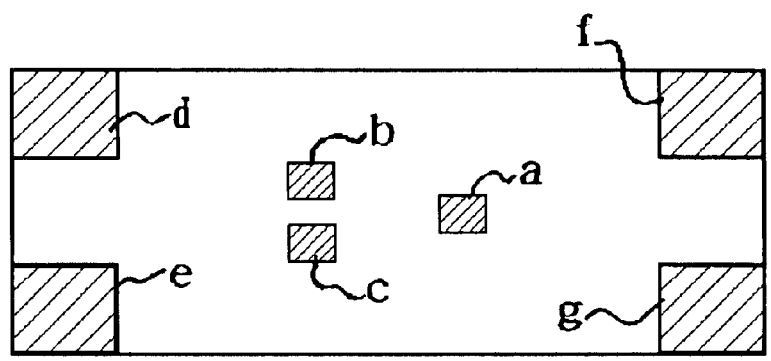
FIG. 2 is a drawing showing thickness measurement points in a third embodiment.

Next, as shown in FIG. 2, the inventors measured the thickness of each film at each of point a slightly deviating from the center to the right, points b and c slightly deviating from the center to the left, points d and e at both left corners, and points f and g at both right corners by the same method as the first example.

Table 4 shows the results of measurement.

TABLE 4

| | Plating film | Thickness at measurement point (µm) | | | | | | |
|---|---|---|---|---|---|---|---|---|
| | | a | b | c | d | e | f | g |
| Example 21 | Ni—P film | 3.91 | 3.71 | 3.61 | 4.05 | 3.86 | 3.66 | 3.75 |
| | Au film | 0.09 | 0.05 | 0.04 | 0.09 | 0.07 | 0.06 | 0.04 |
| Comparative Example 21 | Ni film | 0.68 | 0.69 | 0.69 | 12.70 | 13.42 | 10.38 | 10.37 |
| | Au film | 0.03 | 0.03 | 0.02 | 0.16 | 0.16 | 0.19 | 0.15 |

Table 4 indicates that Comparative Example 21 produces variations of 0.69 µm to 13.42 µm in thickness of the Ni film with the measurement points, and variations of 0.02 µm to 0.19 µm in thickness of the Au film with the measurement points because of differences in the current distribution. Particularly, the Au film is formed by plating with the current density set to obtain a necessary and minimum thickness at each of the measurement points, and thus an excessively large thickness occurs at a point due to a difference in the current distribution (in this embodiment, the thickness at each of the points d to g at both ends of the ceramic base material is larger than the thickness at the central points a to c).

On the other hand, it was confirmed that in example 21, plating proceeds uniformly over the entire surface of the electrode to improve uniformity of the thickness, and a desired plating film can be formed with high efficiency at a low cost.

As described above, the method of manufacturing the electronic part of the present invention comprises performing electroless plating on a work piece, in which an electrode is formed on a surface, by using a plating bath containing a reducing agent to manufacture an electronic part. In this manufacturing method, conductive media exhibiting catalytic activity to oxidation reaction of the reducing agent are mixed with the work piece in the plating bath which contains metal ions having an electrochemically nobler deposition potential than the oxidation-reduction potential of the reducing agent, to form a plating film on the electrode by electroless plating. Therefore, the electrode of the work piece is in contact with the conductive media to render the surface of the electrode catalytically active so that a plating film can be formed on the surface of the electrode by oxidation-reduction reaction between the reducing agent and the deposited metal. Consequently, an electronic part having a plating film with a uniform thickness can be manufactured.

Namely, unlike in electrolytic plating, a metal is not abnormally deposited on a non-metal portion other than the electrode. Even in a multi-terminal electronic part, a desired plating film having a uniform thickness can be formed only on an electrode portion. Furthermore, the plating film has excellent uniformity, and a metal is not deposited on the conductive media, thereby preventing excessive consumption of the deposited metal and suppressing an increase in cost.

Also, a container in which the work piece and the conductive media are charged may be rotated in a plating tank filled with the plating bath to mix the work piece and the conductive media, so that the work piece can easily be brought into contact with the conductive media. Consequently, the surface of the electrode can be rendered catalytically active.

Furthermore, even when electroless plating is performed by a barrel container used for electrolytic barrel plating using the conductive media having an average diameter of 1.0 mm or more, the conductive media can be avoided from being caught in holes of the barrel. In addition, a small-diameter expensive conductive media need not be used to permit the manufacture of a small-size electronic part without an increase in the cost.

Particularly, Ni pieces or Ni alloy pieces are used as the conductive media, and the Ni pieces are mixed with the work piece in the plating bath containing a Ni compound as a main component and a phosphate compound as the reducing agent to form a first plating film composed of Ni as a main component on the electrode by electroless plating, and then the work piece, on which the first plating film is formed, is dipped in the plating bath containing an Au compound as a main component to deposit Au on the surface of the first plating film, to form a second plating film. In this case, the first plating film (Ni—P film) having any desired thickness with excellent uniformity is formed by auto-catalytic plating, and the second plating film (Au film) is then formed by substitutional plating. Particularly, the Au film can be formed with excellent uniformity without excessive deposition, thereby permitting the manufacture of an electronic part at a necessary and minimum cost.

In the present invention, even when a phosphate compound, a boron compound, a nitrogen compound, or an aldehyde compound is used as the reducing agent, desired plating can be performed by appropriating selecting a metal with catalytic activity to oxidation reaction of the reducing agent in any one of various combinations of the reducing agent, the deposited metal, the conductive media, and the electrode material. Therefore, the present invention can be applied to plating of various electronic parts such as printed circuit boards as well as chip-type electronic parts, which are applied a wide variety of uses.

An electronic part of the present invention is manufactured by the above-described manufacturing method, and thus, unlike in conventional electroless plating, an electronic part comprising a plating film uniformly formed only on an electrode can easily be obtained without surface treatment with a catalyst solution containing Pd.

Particularly, a Ni—P layer with good adhesion to Au can be formed directly on a copper electrode, and thus a high-quality electronic part with high reliability can be obtained at a low cost.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of manufacturing an electronic part, the method comprising:

placing a work piece in a plating bath containing a reducing agent and a metal ion having an electrochemically nobler potential than the oxidation-reduction potential of the reducing agent, the work piece having an electrode formed on a surface thereof; and mixing the work piece with conductive media exhibiting catalytic activity to oxidation reaction of the reducing agent in the plating bath to form a plating film on the electrode by the electroless plating.

2. The method of manufacturing an electronic part according to claim 1, wherein a container containing the work piece and the conductive media is rotated, oscillated, inclined or vibrated in a plating tank filled with the plating bath to mix the work piece and the conductive media.

3. The method of manufacturing an electronic part according to claim 1, wherein the conductive media have an average diameter of 1.0 mm or more.

4. The method of manufacturing an electronic part according to claim 1, wherein the conductive media are Ni or Ni alloy pieces, the plating bath contains a nickel compound as a main component and a phosphate compound as the reducing agent so that a first plating film comprising nickel as a main component is formed on the electrode by electroless plating, and the work piece on which the first plating film is formed is further dipped in a plating bath containing a gold compound to deposit Au on the surface of the first plating film to form a second plating film.

5. The method of manufacturing an electronic part according to claim 1, wherein the conductive media are metal pieces comprising at least one metal selected from the group consisting of gold, nickel, palladium, cobalt, platinum, and alloys thereof, and the plating bath contains a phosphate compound as the reducing agent and a salt of a metal selected from the group consisting of nickel, cobalt, palladium, and gold.

6. The method of manufacturing an electronic part according to claim 1, wherein the conductive media are metal pieces comprising at least one metal selected from the group consisting of nickel, cobalt, palladium, platinum, gold, and, alloys thereof, and the plating bath contains a boron compound as the reducing agent and a salt of at least one metal selected from the group consisting of nickel, cobalt, palladium, and gold.

7. The method of manufacturing an electronic part according to claim 6, wherein the plating bath further contains a metal salt of a metal selected from the group consisting of nickel, cobalt, palladium, gold, and platinum.

8. The method of manufacturing an electronic part according to claim 1, wherein the conductive media are metal pieces comprising at least one metal selected from the group consisting of cobalt, nickel, platinum, palladium and, alloys thereof, and the plating bath contains a nitrogen compound as the reducing agent and a salt of a metal selected from the group consisting of nickel, cobalt, palladium, gold, and platinum.

9. The method of manufacturing an electronic part according to claim 1, wherein the electrode is one of a copper electrode, a copper alloy electrode, a silver electrode, a nickel electrode, and a silver alloy electrode.

10. The method of manufacturing an electronic part according to claim 9, wherein the silver alloy electrode comprises silver as a main component, and palladium as a sub-component.

11. The method of manufacturing an electronic part according to claim 1, wherein the conductive media are metal pieces comprising at least one metal selected from the group consisting of copper, gold, silver, and alloys thereof, and the plating bath contains an aldehyde compound as the reducing agent, and a metal salt of a metal selected as a main component from the group consisting of copper, silver, and gold.

12. The method of manufacturing an electronic part according to claim 11, wherein the electrode is a nickel electrode.

13. An electroless plating method comprising:

mixing a work piece having a surface portion to be plated and conductive media exhibiting catalytic activity to oxidation reaction of a reducing agent in a plating bath containing the reducing agent and a metal ion having an electrochemically nobler deposition potential than the oxidation-reduction potential of the reducing agent to form a plating film on the surface portion of the work piece to be plated based on the metal ion, wherein the average diameter of the conductive media is 1.0 mm or more.

14. The electroless plating method according to claim 13, comprising rotating, oscillating, inclining or vibrating a container containing the work piece and the conductive media in a plating tank filled with the plating bath to mix the work piece and the conductive media.

15. The electroless plating method according to claim 13, wherein the conductive media are metal pieces comprising at least one metal selected from the group consisting of gold, nickel, palladium, cobalt, platinum, and alloys thereof, and the plating bath contains a phosphate compound serving as the reducing agent, and a metal salt of a metal selected from the group consisting of nickel, cobalt, palladium and gold.

16. The electroless plating method according to claim 13, wherein the conductive media are metal pieces comprising at least one metal selected from the group consisting of nickel, cobalt, palladium, platinum, gold, and alloys thereof, and the plating bath contains a boron compound serving as the reducing agent, and a metal salt of at least one metal selected from the group consisting of nickel, cobalt, palladium, gold and platinum.

17. The electroless plating method according to claim 13, wherein the conductive media are metal pieces comprising at least one metal selected from the group consisting of cobalt, nickel, platinum, palladium, and alloys thereof, and the plating bath contains a nitrogen compound serving as the reducing agent, and a metal salt of a metal selected from the group consisting of nickel, cobalt, palladium, gold and platinum.

18. The electroless plating method according to claim 13, wherein the conductive media are metal pieces comprising at least one metal selected from the group consisting of copper, gold, silver and, alloys thereof, and the plating bath contains an aldehyde compound as the reducing agent, and a salt of a metal selected from the group consisting of copper, silver, and gold.

19. An electroless plating method comprising:

mixing a work piece having a surface portion to be plated and conductive media exhibiting catalytic activity to oxidation reaction of a reducing agent in a plating bath containing the reducing agent and a metal ion having an electrochemically nobler deposition potential than the oxidation-reduction potential of the reducing agent to form a plating film on the surface portion of the work piece to be plated based on the metal ion, wherein the conductive media are nickel pieces or nickel alloy pieces, the plating bath contains a phosphate compound as the reducing agent, and a nickel compound as a precursor of the metal ion so that a first plating film mainly composed of nickel is formed on the portion to be plated by electroless plating, and the work piece, on which the first plating film is formed, is further dipped in a second plating bath containing a gold compound to deposit gold on the surface of the first plating film to form a second plating film mainly composed of gold.

20. An electroless plating method comprising:

mixing a work piece having a surface portion to be plated and conductive media exhibiting catalytic activity to oxidation reaction of a reducing agent in a plating bath containing the reducing agent and a metal ion having an electrochemically nobler deposition potential than the oxidation-reduction potential of the reducing agent to form a plating film on the surface portion of the work piece to be plated based on the metal ion, wherein the material of the surface portion to be plated is one of copper, silver, nickel and an alloy thereof.

21. An electroless plating method comprising:

mixing a work piece having a surface portion to be plated and conductive media exhibiting catalytic activity to oxidation reaction of a reducing agent in a plating bath containing the reducing agent and a metal ion having an electrochemically nobler deposition potential than the oxidation-reduction potential of the reducing agent to form a plating film on the surface portion of the work piece to be plated based on the metal ion, wherein the conductive media are metal pieces comprising at least one metal selected from the group consisting of copper, gold, silver and, alloys thereof, and the plating bath contains an aldehyde compound as the reducing agent, and a salt of a metal selected from the group consisting of copper, silver, and gold, and wherein the material of the surface portion to be plated is nickel.

* * * * *